United States Patent [19]

Weiss

[11] 4,328,897
[45] May 11, 1982

[54] RACK FOR ACCOMMODATING CIRCUIT BOARDS

[75] Inventor: Harald Weiss, Bremen, Fed. Rep. of Germany

[73] Assignee: Vero Electronics GmbH, Bremen, Fed. Rep. of Germany

[21] Appl. No.: 91,945

[22] Filed: Nov. 7, 1979

[30] Foreign Application Priority Data

Nov. 8, 1978 [DE] Fed. Rep. of Germany ... 7833194[U]
Nov. 8, 1978 [DE] Fed. Rep. of Germany ... 7833195[U]

[51] Int. Cl.³ ............................................. H02B 1/02
[52] U.S. Cl. ..................................... 211/41; 361/415
[58] Field of Search ..................... 211/41, 184, 43, 40; 108/61; 361/415; 108/61

[56] References Cited

U.S. PATENT DOCUMENTS 3,184,069 5/1965 Rosenberg ............................ 211/41
3,458,767 7/1969 Hedger et al. .................... 211/41 X
3,511,385 5/1970 Ayling ................................. 211/41
3,939,382 2/1976 Lacan et al. ...................... 211/41 X Primary Examiner—Roy D. Frazier
Assistant Examiner—Robert W. Gibson, Jr.
Attorney, Agent, or Firm—Watson, Cole, Grindle & Watson

[57] ABSTRACT

A rack for accommodating circuit boards includes a pair of metal end plates joined by pairs of front and rear extruded metal tie bars. Slotted guide rails moulded from plastics materials are capable of being snap fitted into position between the front and rear tie bars.

4 Claims, 4 Drawing Figures

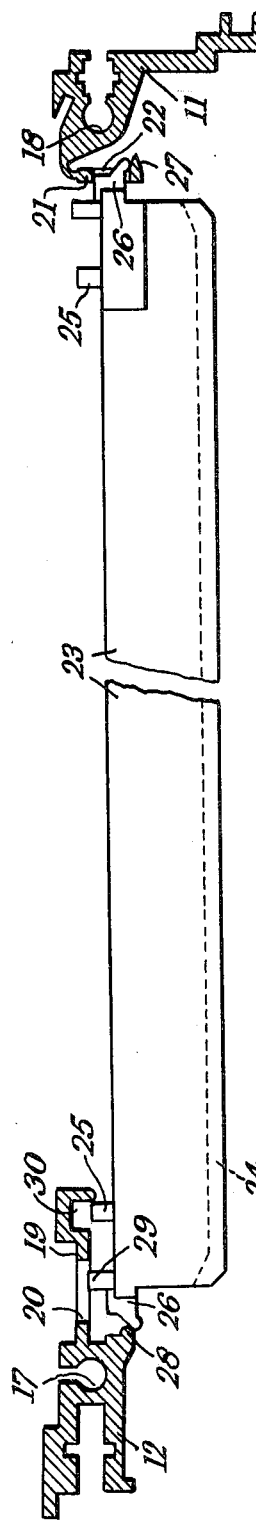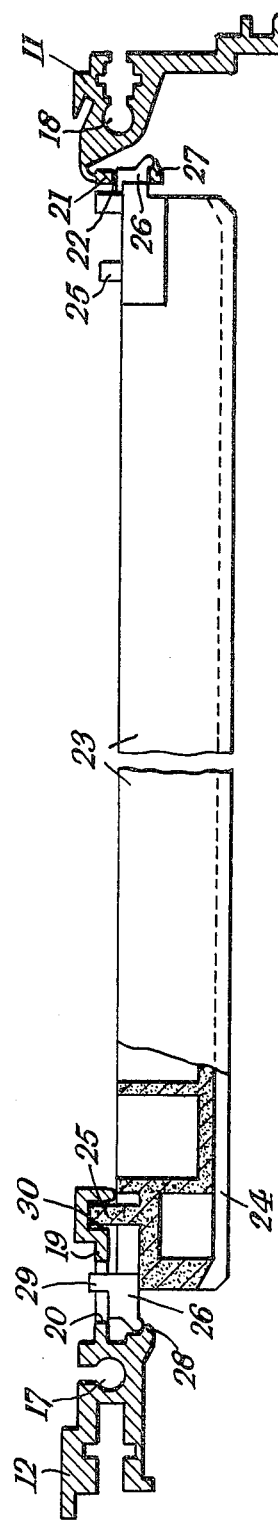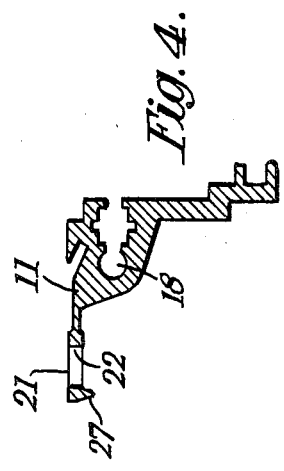

RACK FOR ACCOMMODATING CIRCUIT BOARDS

FIELD OF THE INVENTION

This invention is concerned with a rack for accommodating circuit boards of the type, hereinafter termed the type specified, comprising two metal end plates, pairs of upper and lower extruded metal tie bars which are fixed at their opposite ends to the end plates, and guide rails moulded from plastics material which extend between the upper tie bars and between the lower tie bars in directions parallel to the end plates in opposed pairs, the guide rails being attached at their ends to the tie bars and having grooves in their opposing faces for accommodating the upper and lower edges of circuit boards slid endwise into the rack. Such racks can also be used to accommodate modules carrying larger electrical components than a circuit board and having upper and lower rails which can be slid into the grooves in appropriate upper and lower guide rails.

SUMMARY OF THE INVENTION

The metal end plates and the extruded metal tie bars can readily be so assembled that the spacing of the tie bars is held within very close tolerances. The guide rails, however, being moulded from plastics material are necessarily subject to a small variation in overall length of the order of ±2 thousandths of an inch. The present invention enables the guide rails to be snap fitted into position with respect to the tie bars and, despite the above-mentioned dimensional tolerance, nevertheless be firmly and precisely located both vertically and horizontally.

The invention accordingly provides a rack of the type specified, wherein the rear tie bars have regular pitched slots for accommodating the rear ends of guide rails in a forwardly facing vertical face, the front tie bars having corresponding regularly pitched slots for accommodating the front ends of guide rails in an upwardly facing horizontal face, and each guide rail has at its rear end a projection capable of insertion into a slot in a rear tie bar with the guide rail located vertically but capable of limited horizontal movement with respect to the tie bar and at its front end a projection capable of deforming as it enters a corresponding slot in the corresponding front tie bar by cooperation with a portion of the front tie bar which then locates the guide rail horizontally.

A guide rail can accordingly readily be inserted into the rack by sliding its rear end in a direction slightly inclined to the horizontal into a slot in the rear tie bar and then clipping its front end into the corresponding slot in the front tie bar. The guide rail is then firmly and accurately located both horizontally and vertically notwithstanding the permitted dimensional tolerance. It can be removed equally easily by the reverse procedure.

Preferably the guide rails are symmetrical, having at each end a projection for fitting to a rear tie bar and a projection for fitting to a front tie bar, so that the guide bar can be used either way round.

Preferably also, in order to enable the rear tie bars to be of compact construction, the slots are machined in a flange which initially extends outwardly from the tie bar and is folded upwardly, after machining into a vertical position.

BRIEF DESCRIPTION OF THE DRAWINGS

One embodiment of the invention will now be described in detail, by way of example, with reference to the accompanying drawings, in which:

FIG. 2 is a sectional view on a larger scale showing a guide rail in process of mounting between the tie bars, FIG. 3 is a similar view showing the guide rail fully mounted in position, and FIG. 4 is a sectional view showing a rear tie bar in course of manufacture.

DETAILED DESCRIPTION OF A PREFERRED EMBODIMENT

Figure 1:
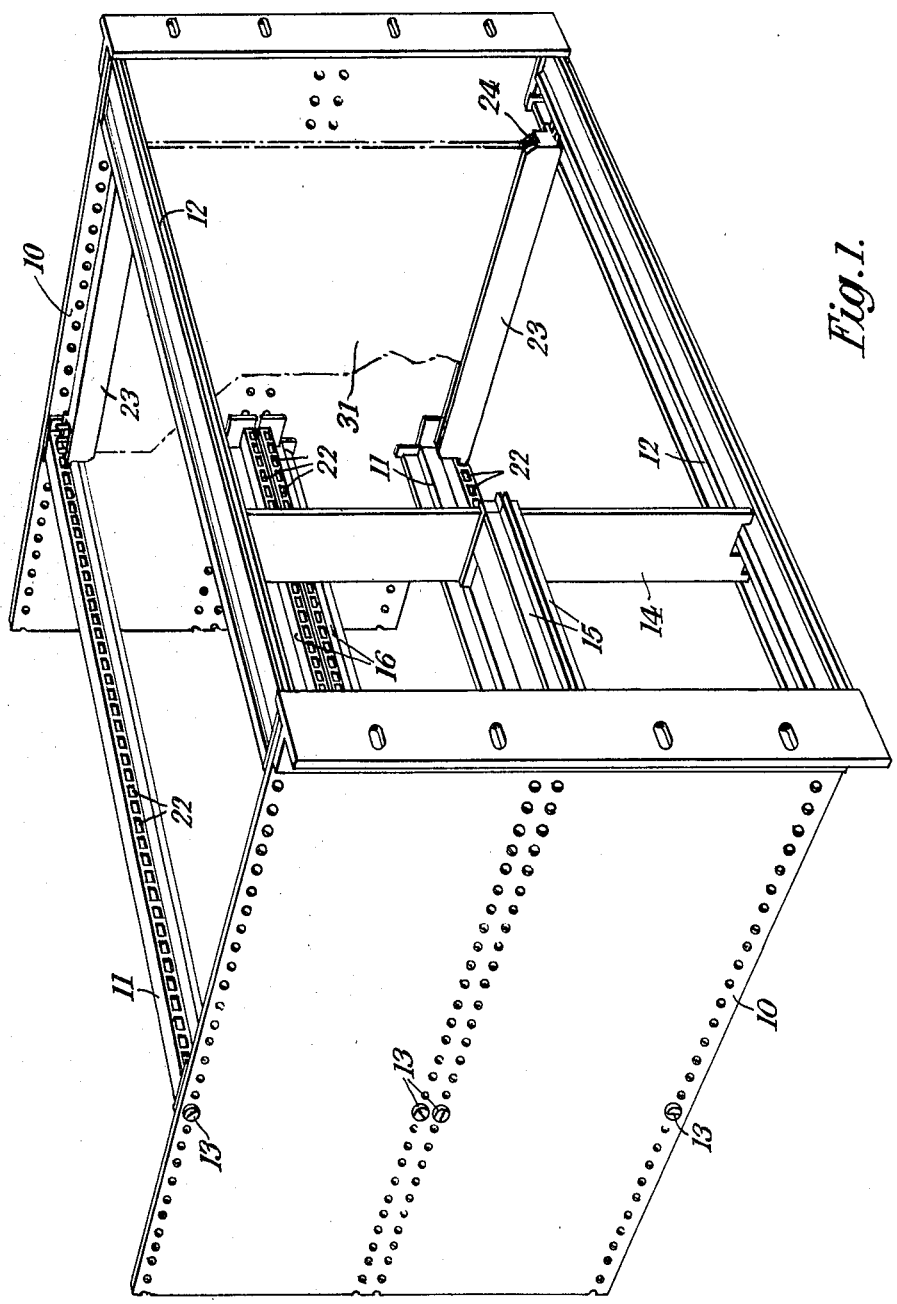
FIG. 1 is a perspective view of a rack with the guide rails omitted.

As shown in FIG. 1, the rack consists of a pair of metal end plates 10, joined by a pair of opposed rear tie bars 11 and a pair of front tie bars 12 which are extruded metal sections and are attached to the end plates by screws 13. The front and rear tie bars 12,11 are spanned by opposed pairs of guide rails 23, shown in more detail in FIGS. 2 and 3, which are moulded from plastics material and are formed with slots in their opposing faces to enable circuit boards or modules to be slid into the rack.

As illustrated the rack may be divided by a divider plate 14 into sections for respectively accommodating wider and narrow circuit boards, in which case the section for the narrow boards includes a pair of intermediate front tie bars 15, placed back-to-back and extending between one end plate and the divider plate, and a pair of intermediate rear tie bars 16 is provided between the two end plates.

As shown in FIGS. 2 and 3, the front and rear tie bars 12,11 have throughgoing holes 17, 18 respectively, which are tapped at their ends to accommodate the fixing screws 13. Each front tie bar 12 has a flange 19, which extends horizontally when the tie bar is mounted in the rack and is pierced with regularly pitched square slots 20. Each rear tie bar 11 has a flange 21, which extends vertically when the tie bar is mounted in the rack and is pierced with regular pitched square slots 22.

Each rear tie bar 11 is extruded in the configuration shown in FIG. 4, with the flange 21 extending horizontally to enable the slots 22 to be formed in it. After this operation has been performed the flange 21 is folded into the vertical position shown in FIGS. 2 and 3.

Each guide rail 23 is formed with a slot 24 for accommodating the edge of a circuit board and has ends of identical configuration. At each end the guide bar has an inboard upward projection 25 and two outboard projections 26 which are spaced in the widthwise direction, so that one only is visible in FIGS. 2 and 3. To mount a guide rail its projections 26 at one end are introduced through a slot 22 in a rear tie bar 11 into engagement with a hook 27 at the end of the flange 21. The projections 26 at its other end are then offered up to the front tie bar 12 and yield, due to the flexible nature of the plastics material, to snap over a hook 28 on the front tie bar, upward extensions 29 of the projections entering a slot 20 in the front tie bar. The projections 25 then engage a slot 30 in the front tie bar, as shown in FIG. 3. When so mounted the guide rail 23 is firmly located, notwithstanding slight variations in its length, both vertically and horizontally.

What I claim as my invention and desire to secure by Letters Patent is:

1. A rack for accommodating circuit boards, comprising two metal end plates, opposed pairs of upper and lower extruded metal tie bars fixed at their opposite ends to the end plates, and guide rails molded from plastics material which extend between the upper tie bars and between the lower tie bars in directions parallel to the end plates in opposed pairs, the guide rails being attached at the ends thereof to the tie bars and having grooves in the opposing faces thereof for accommodating the upper and lower edges of circuit boards slid endwise into the rack, each of said rear tie bars having a forwardly facing vertical face formed with regularly pitched slots for accommodating the rear ends of said guide rails, each of said front tie bars having a horizontal face formed with slots regularly pitched at the same pitch as the slots in the rear tie bars for accommodating the front ends of said guide rails, each guide rail having at the rear end thereof a projection capable of insertion into one of said slots in a rear tie bar to locate said guide rail vertically and capable of limited horizontal movement with respect to said tie bar, said guide rail also having at the front end thereof a deformable projection for entry into a slot in the opposed front tie bar, each front tie bar having adjacent each slot therein a portion operative to deform said deformable projection as it enters said slot and thereafter to locate said guide rail horizontally.

2. A rack according to claim 1, wherein said projections on the rear ends of said guide rails are hooked formations on said guide rails.

3. A rack according to claim 1, wherein said guide rails are symmetrical and have identical deformable projections at each respective end thereof.

4. A rack according to claim 1, wherein said vertical faces in said rear tie bars are constituted by flanges capable of folding with respect to said tie bars.

* * * * *